United States Patent [19]

Krynicki

[11] Patent Number: 4,536,638

[45] Date of Patent: Aug. 20, 1985

[54] CHIP ASSEMBLY

[76] Inventor: Witold Krynicki, 321 W. Leroy Ave., Arcadia, Calif. 91006

[21] Appl. No.: 429,845

[22] Filed: Sep. 30, 1982

[51] Int. Cl.³ ............................................. B23K 26/00
[52] U.S. Cl. ................................ 219/121 LC; 361/401
[58] Field of Search ................ 219/121 LC, 121 LD, 219/121 LE, 121 LF; 361/401; 174/52 PF; 339/75 M, 176 PM, DIG. 3

[56] References Cited

U.S. PATENT DOCUMENTS

| | | | |
|---|---|---|---|
| 3,777,221 | 12/1973 | Tatusko et al. | 361/401 |
| 3,910,664 | 10/1975 | Pauza et al. | 339/75 M X |
| 4,143,508 | 3/1979 | Ohno | 361/401 X |
| 4,144,648 | 3/1979 | Grovender | 339/75 M |

Primary Examiner—C. L. Albritton

[57] ABSTRACT

A chip substrate providing registration features for chip components on the opposite to the circuit side with interconnecting through holes and method and means for simultanuously trimming these registration features for dimentional and location accuracy, drilling the interconnecting through holes for perfect registration with the registration features, and photoetching the high density portion of the circuit in and around the chip area.

9 Claims, 8 Drawing Figures

CHIP ASSEMBLY

BACKGROUND OF THE INVENTION

This invention concerns in general, the manufacture of hybrid circuits, and in particular the final assembly and packaging of chip components unto substrates or chip carriers, including a novel substrate or chip carrier for one or several components, and assembly methods and equipment.

Chip assemblies can be broadly classified according to the method of interconnection between terminal pads on substrate and chip, into two general groups: wire bonding, and face bonding methods. The wire bonding group includes the wire bonding proper, wherein wires are welded to corresponding terminal pads on chip and substrate, and modified systems including beam lead chips, having extended buss leads integral with the chip element; Tab systems, or Tape Automated Bonding, which uses leads fabricated in continuous film type format. The leads are cut off after being gang bonded to the chip terminal pads. The face bonding type, also called flip-chip, because the chip is flipped over face to face with the substrate, bringing terminal pads on the chip facing corresponding terminal pads on the substrate. Local welding at the pads is achieved either by means of providing protruding terminal pads on the chip, as in the bump, pillar and pedestal bonding methods or with the aid of additional standoffs, as in the ball-soldering method.

The present invention is of the flip-chip category.

These existing systems are suffering from one or several of the following shortcomings: they are more costly to produce; they do not lend themselves readily to automating; they require additional work done to the chip component and therefore existing chips cannot be used directly; the resulting assembly is not rugged; they result in severily reduced terminal density; and, cannot be used with an unlimited number of terminals.

SUMMARY OF THE INVENTION

It is therefore the purpose of the invention to provide a chip-substrate assembly that is readily amenable to automation methods and at the same time overcomes the shortcumings associated with present systems as enumerated above and additional avantages that may still be mentioned in or that will be apparent from the following description.

In the present invention nesting cavities are provided on the backside of the substrate, to locate and hold the chip, and electrical interconnections are made by means of through-holes in the substrate directly from terminal pads on the chip to terminal pads on the printed circuit. Tapered walls at the top of the cavity provide mechanical side alignement as the chip is lowered into and in place into the cavity, and thus corrects the positioning inaccuracy of the chip placement mechanism.

In many applications a molded cavity and molde-in through-holes are adequate. For higher terminal counts on the chip and for smaller chips, the cavity is trimmed to size and precise location, and the through-holes are drilled at the same time by means of a high energy radiant beam, such as a laser or electron beam machine. It is this simultaneous trimming of the cavity and the drilling of the holes that makes it possible to properly interconnect, on an economical automatic basis, the printed circuit with the micro size chip terminal pads. In most cases, chips that have been produced with conventional methods can be used directly. For high density applications the chip is also trimmed to size. To reduce the trimming time, on both the chip and the carrier, registration is limited to a short section at the corners only.

In many cases, again, a printed circuit on the substrate would be adequate, in high-density terminal-pad applications, however, the circuit within and around the area of the chip and leading from the through-holes to the printed circuit will be photoetched, also at the same time as the through-holes are drilled and the cavity is trimmed to size. A great lattitude of alignment is available between the wide printed circuit lines and the super thin photoetched lines.

A novel method for filling the through-holes with conductive material and making electrical contact with the chip terminal pads is used, comprised of: laying down a layer of conductive material in powder form on the circuit side of the substrate and then laser melting the amount of powder over and inside the hole, and causing the melt to run down into the hole and into contact with the chip terminal pad. A non wetting coat on the substrate will prevent capilary effects.

The substrate can be fabricated as a sandwich, comprising a top layer containing shaped holes to form the cavity walls, and a bottom plate to provide the bottom for the cavities, both layers being cemented together after being fired separately and prior to being machined.

Having solved the interconnection problem by eliminating the manual lead welding operation, and by eliminating the necessity of precision chip placement, a total automatic assembly is possible. This would typically be done on a multiple purpose multiple station assembly machine comprising the the laser trimming and drilling functions described above, and comprising also component placement functions.

DETAILED DESCRIPTION OF THE EMBODIMENTS

Figure 1:
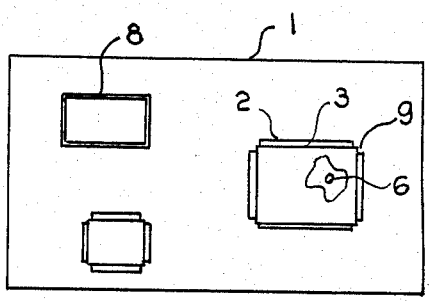
FIG. 1 is a plan view showing the chip side of the substrate
Figure 2:
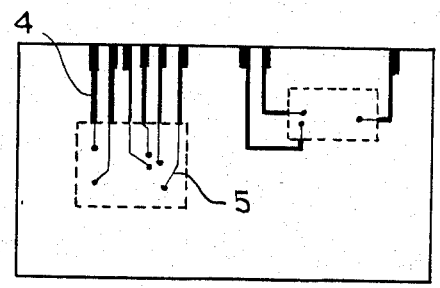
FIG. 2 is a plan view showing the circuit side of the substrate
Figure 3:
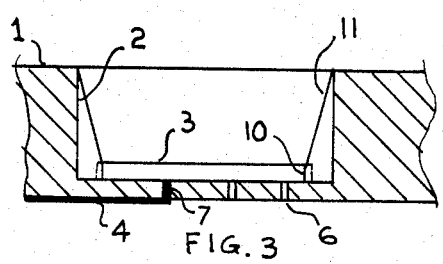
FIG. 3 is a cross-sectional view of a chip cavity
Figure 4:
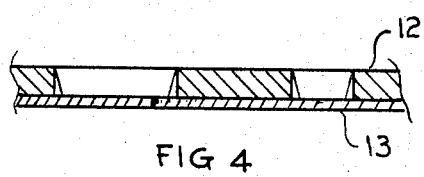
FIG. 4 is a cross-sectional view of a sandwiched substrate
Figure 5:
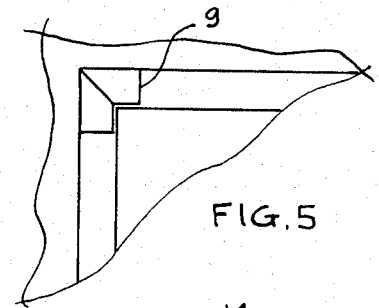
FIG. 5 is a detail view of the cavity-chip corner configuration
Figure 6:
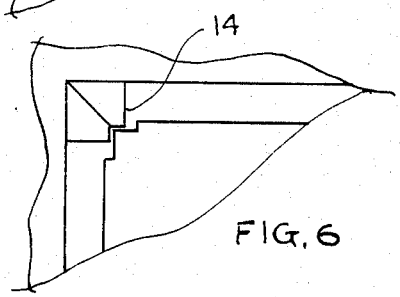
FIG. 6 is an alternative cavity-chip corner configuration
Figure 7:
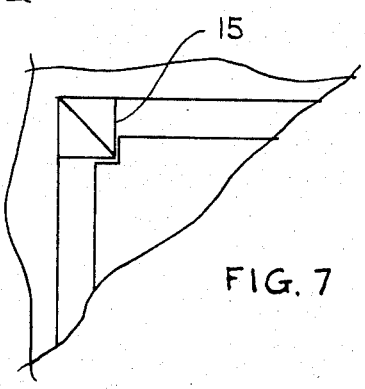
FIG. 7 is still another cavity-chip corner configuration
Figure 8:
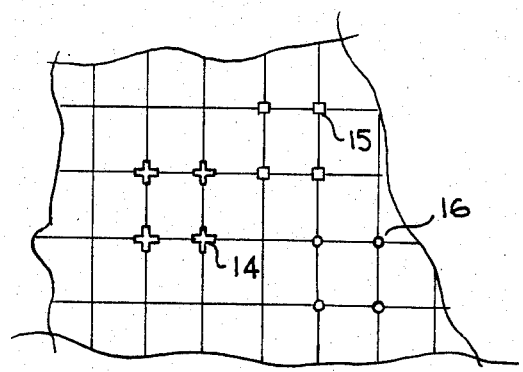
FIG. 8 is a view of a section of a wafer showing machining modes for the configurations of FIGS. 5, 6, and 7.

The prefered embodiment is shown in FIGS. 1, 2, and 3, and consists of: a substrate 1; a typical cavity 2; a chip 3, shown nested in said cavity and oriented face down, with the terminal pads in close proximity with the bottom of the cavity; a printed circuit 4, on the opposite side to the chip cavity side; a photoetched circuit 5, providing much finer lines than the printed circuit for high density areas, such as would be in and around the chip area; through holes 6, filled with conducting material 7, and interconnecting said chip 3 with terminal pads on said printed or photoetched circuits 4 or 5; the cavity could be rectangular as shown at 8, but in the prefered embodiment retainment of the chip is made at its corners only, by means of reentrent corner sections 9, shown in greater detail in FIG. 5, and in the cross-sectional view of FIG. 3, and comprising a lower straight portion 10, and a tapered portion 11, extending from said straight portion 10 to the top of the cavity, and provided to effect the final alignment of the chip as it is positioned into the cavity by any conventional chip placement mechanism or person. Said straight portion 10, and through holes 6, and said photoetched circuit 5, are processed all at the same time, the square corners are trimmed to size and precise location the through holes are drilled in perfect spacing and registration with the machined corners, and the photoetched circuit is etched in perfect alignment with the holes. The alignment with the printed circuit is not so critical, since the printed circuit lines will be much wider than the photo-etched lines, as shown. Many corner patterns are possible, two additional configurations are shown in FIGS. 6 and 7, at 14 and 15, and the hole style 16, in FIG. 8. The chips would be machined when still in wafer form, as shown in FIG. 8, and at the same time as the scribing operation.

What I claim is:

1. An integrated circuit chip carrier assembly comprising: a molded chip carrier substrate including a cavity portion molded-in chip registration elements in the cavity portion molded on said substrate and on one first side of said cavity portion; at least one chip comprising terminal pads and positioned within said registration elements with the side containing terminal pads facing said substrate; said molded substrate containing interconnecting through-holes corresponding to said terminal pads on said chip; a printed circuit on the second opposite side of said molded chip carrier substrate and printed through said through-holes and in electrical contact with said terminal pads on said chip.

2. An integrated circuit chip carrier assembly as claimed in claim 1, also comprising precision trimmed sections within said molded registration elements to provide a perfect fit on said chips and precision drilled said interconnecting through-holes for perfect registration between said holes and said registration elements.

3. An integrated circuit chip carrier assembly as claimed in claim 1, also comprising high density photoetched circuits in the chip area.

4. An integrated circuit chip carrier assembly as claimed in claim 1, wherein said registration elements comprise at least two corner posts for each chip.

5. An integrated circuit chip carrier assembly as claimed in claim 1, wherein said registration elements consists of cavities shaped to fit said chip accurately.

6. An integrated circuit chip carrier assembly as claimed in claim 5, wherein said cavities have reentrent corners to fit said chips at the corners only.

7. An integrated circuit chip carrier assembly as claimed in claim 1, and including laser fused powder metal interconnections between said printed circuit and said terminal pads.

8. An integrated circuit chip carrier assembly as claimed in claim 5, wherein said substrate comprises an upper layer containing the cavity portion of said molded chip carrier substrate, and a second layer forming the bottom portion of said molded chip carrier substrate, and means for permanently bonding said two layers into a solid structure.

9. An integrated circuit chip carrier assembly as claimed in claim 2 or 6 also comprising high energy beam trimmed sections within said molded registration elements, and high energy beam drilled through-holes in precise dimensional relationship with said registration elements.

* * * * *